US010283620B2

(12) United States Patent
Bao et al.

(10) Patent No.: US 10,283,620 B2
(45) Date of Patent: May 7, 2019

(54) APPROACH TO CONTROL OVER-ETCHING OF BOTTOM SPACERS IN VERTICAL FIN FIELD EFFECT TRANSISTOR DEVICES

(71) Applicant: INTERNATIONAL BUSINESS MACHINES CORPORATION, Armonk, NY (US)

(72) Inventors: Ruqiang Bao, Wappingers Falls, NY (US); Hemanth Jagannathan, Niskayuna, NY (US); Paul C. Jamison, Hopewell Junction, NY (US); ChoongHyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/416,281

(22) Filed: Jan. 26, 2017

(65) Prior Publication Data
US 2018/0212037 A1    Jul. 26, 2018

(51) Int. Cl.
*H01L 29/66*    (2006.01)
*H01L 29/786*    (2006.01)
*H01L 29/423*    (2006.01)
*H01L 21/324*    (2006.01)
*H01L 21/02*    (2006.01)
*H01L 29/78*    (2006.01)

(52) U.S. Cl.
CPC .. *H01L 29/66553* (2013.01); *H01L 21/02247* (2013.01); *H01L 21/02252* (2013.01); *H01L 21/324* (2013.01); *H01L 29/42392* (2013.01); *H01L 29/66666* (2013.01); *H01L 29/7827* (2013.01); *H01L 29/78642* (2013.01); *H01L 29/78696* (2013.01)

(58) Field of Classification Search
CPC ............... H01L 29/66666; H01L 29/66553
See application file for complete search history.

(56) References Cited

U.S. PATENT DOCUMENTS

| | | | |
|---|---|---|---|
| 5,512,517 A | 4/1996 | Bryant | |
| 6,841,831 B2 | 1/2005 | Hanafi et al. | |
| 7,176,089 B2 | 2/2007 | Furukawa et al. | |
| 7,648,880 B2 | 1/2010 | Chan et al. | |
| 8,138,039 B2 | 3/2012 | Tang et al. | |
| 9,070,712 B2 | 6/2015 | Witters | |
| 9,202,917 B2 | 12/2015 | Ching et al. | |
| 9,837,405 B1 | 12/2017 | Cheng et al. | |

(Continued)

OTHER PUBLICATIONS

Oshima et al., "Chemical Bonding, Interfaces, and Defects in Hafnium Oxide/Germanium Oxyditride Gate Stacks on Ge(100)", Journal of The Electrochemical Society. vol. 155(12). Oct. 17, 2008. pp. G304-G309.

(Continued)

*Primary Examiner* — Asok K Sarkar
*Assistant Examiner* — Grant S Withers
(74) *Attorney, Agent, or Firm* — Tutunjian & Bitetto, P.C.; Vazken Alexanian

(57) ABSTRACT

A method of forming a vertical fin field effect transistor device, including, forming one or more vertical fins with a hardmask cap on each vertical fin on a substrate, forming a fin liner on the one or more vertical fins and hardmask caps, forming a sacrificial liner on the fin liner, and forming a bottom spacer layer on the sacrificial liner.

15 Claims, 13 Drawing Sheets

(56) References Cited

U.S. PATENT DOCUMENTS

| | | |
|---|---|---|
| 2005/0072988 A1 | 4/2005 | Augusto |
| 2015/0123193 A1* | 5/2015 | Masuoka ............ H01L 21/2251 |
| | | 257/329 |
| 2015/0228499 A1 | 8/2015 | Parkinson et al. |
| 2015/0287784 A1 | 10/2015 | Yu et al. |
| 2017/0154954 A1* | 6/2017 | Lin ................... H01L 21/28264 |
| 2018/0006023 A1 | 1/2018 | Nowak et al. |
| 2018/0006024 A1 | 1/2018 | Anderson et al. |
| 2018/0053821 A1 | 2/2018 | Mallela et al. |
| 2018/0053840 A1 | 2/2018 | Mallela et al. |
| 2018/0090388 A1 | 3/2018 | Anderson et al. |
| 2018/0130895 A1 | 5/2018 | Park et al. |

OTHER PUBLICATIONS

Gregory et al., "Electrical Characterization of Some Native Insulators on Germanium", Materials Research Society Proceedings. vol. 76. Jan. 1, 1986. pp. 307-311.

Onsia et al., "A study of the Influence of Typical Wet Chemical Treatments on the Germanium Wafer Surface", Solid State Phenomena. vols. 103-104. Apr. 1, 2005. pp. 19-22.

Office Action with cited art in corresponding U.S. Appl. No. 15/918,199 dated Jul. 25, 2018.

Hartmann, "Selective Epitaxial Growth of Boron-and Phosphorus-doped Si and SiGe for Raised Sources and Drains", Journal of Crystal Growth, Mar. 2004, pp. 36-47.

U.S. Office Action issued in USSN: 15,918,199 dated Feb. 21, 2019, 15 pages.

* cited by examiner

APPROACH TO CONTROL OVER-ETCHING OF BOTTOM SPACERS IN VERTICAL FIN FIELD EFFECT TRANSISTOR DEVICES

BACKGROUND

Technical Field

The present invention generally relates to decreasing etchback of bottom spacers for vertical fin field effect transistors by using a sacrificial liner that provides increased selectivity for nitride etching processes, and more particularly to use of a germanium oxide sacrificial liner on vertical fin sidewalls that has a higher nitride etch rate in comparison to silicon oxynitride.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a method of forming a vertical fin field effect transistor device is provided. The method includes forming one or more vertical fins with a hardmask cap on each vertical fin on a substrate, forming a fin liner on the one or more vertical fins and hardmask caps, forming a sacrificial liner on the fin liner, and forming a bottom spacer layer on the sacrificial liner.

In accordance with another embodiment of the present invention, a method of forming a vertical fin field effect transistor device is provided. The method includes forming a plurality of vertical fins with a hardmask cap on each vertical fin on a substrate, forming a silicon oxide fin liner on the plurality of vertical fins and hardmask caps, forming a germanium oxide sacrificial liner on the fin liner, and forming a silicon nitride bottom spacer layer on the sacrificial liner.

In accordance with another embodiment of the present invention, a vertical fin field effect transistor device is provide. The vertical fin field effect transistor device includes one or more vertical fin(s) on a substrate, a hardmask cap on each of the one or more vertical fin(s), a bottom source/drain at the surface of the substrate, where at least a portion of the bottom source/drain is below at least one of the one or more vertical fin(s), a silicon oxide fin liner on at least a portion of the bottom source/drain, a germanium oxynitride sacrificial liner on the fin liner, and a silicon nitride bottom spacer on the germanium oxynitride sacrificial liner.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
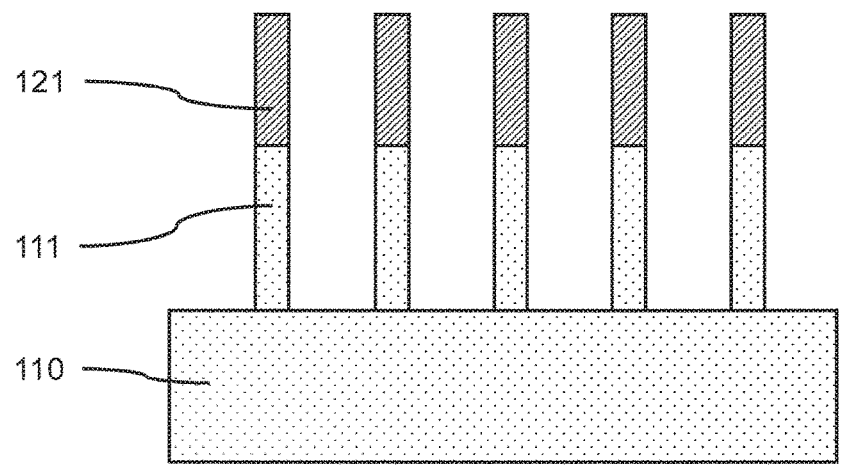
FIG. 1 is a cross-sectional side view showing a plurality of vertical fins with a hardmask cap on each fin, in accordance with an embodiment of the present invention.

Principles and embodiments of the present invention relate generally to a change in the protective liner material used to cover the vertical fin(s) of a fin field effect transistor device prior to formation of a nitride bottom spacer. In various embodiments, a silicon oxide layer is at least partially replaced by a protective layer made of a material that has an increased etch rate after partial nitridation compared to silicon oxynitride.

It has been found that use of a high density plasma (HDP) for formation of a silicon nitride bottom spacer layer of a finFET device can cause at least partial nitridation of a silicon oxide (SiO) layer covering the sidewalls of a vertical fin to form silicon oxynitride (SiON). The etch rate of silicon oxynitride is closer to the etch rate of silicon nitride (e.g., $Si_3N_4$) than silicon oxide (e.g., $SiO_2$), so the conversion of the liner material during formation of a bottom spacer results in poorer etch selectivity between the liner and vertical fins and the bottom spacer, for example, during an etch-back process to remove the liner from the fin sidewalls. The reduction in selectivity makes it more difficult to completely remove the liner material from the vertical fin sidewalls without damaging and/or over-etching the bottom spacer with either a SiConi™ etch process (i.e., remote plasma dry etch including $H_2$, $NF_3$, and $NH_3$ plasma by-products) or a hydrogen fluoride etch (e.g., aqueous hydrofluoric acid, hydrogen fluoride gas/plasma).

Typically the bottom spacer provides at least a portion of the electrical insulation and physical separation between a bottom source/drain and a gate structure on the vertical fin (an insulating high-k dielectric layer may also be interposed between the conductive gate electrode and the bottom source/drain). Over-etching can cause a reduction in the bottom spacer's resistivity, resulting in device failure due to shorting between the gate and bottom source/drain, and increased parasitic capacitances between the gate electrode and the bottom source/drain. Each issue can degrade the overall device performance.

Leaving a nitrided residue of the SiO liner on the vertical fin(s) can cause severe gate stack issues, for example, increased interface traps, inversion thickness, $T_{inv}$, $T_{oxgl}$ (the equivalent $SiO_2$ thickness that would result in the same gate leakage current as high-k gate dielectric material), and a high interface trap density, $D_{it}$.

Principles and embodiments of the present invention relate generally to a simple and easy way to strip a sidewall fin liner utilizing the high selectivity etch rate of GeON/$SiO_2$ over the SiN bottom spacer.

Principles and embodiments of the present invention relate to formation of a sacrificial liner that can react with nitriding species during formation of a bottom spacer to form an oxynitride that can subsequently be selectively removed without over etching the bottom spacer and fin hardmask caps. Germanium oxide (GeO), aluminum oxide (e.g., AlO), lanthanum oxide (e.g., LaO), or combinations thereof, can be used to form germanium oxynitride (GeON), lanthanum oxynitride (LaON), and aluminum oxynitride (AlON). The oxide sacrificial liner (e.g., $GeO_2$) can overlay a silicon oxide (SiO) liner to prevent nitridation of the SiO to SiON.

Principles and embodiments of the present invention also relate to formation of a bilayer protective liner on a vertical fin to ensure complete removal of the protective liner after formation of a silicon nitride bottom spacer using typical nitride etching processes (e.g., SiConi™ etch or a hydrogen fluoride etch).

Exemplary applications/uses to which the present invention can be applied include, but are not limited to: integrated semiconductor devices having FinFETs.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It should be noted that materials may be referred to only by their composition constituent, e.g., silicon, nitrogen, oxygen, carbon, hafnium, titanium, etc., without specifying a particular stoichiometry (e.g., SiGe, $SiO_2$, $Si_3N_4$, $HfO_2$, etc.) in recognition that the stoichiometry can vary based on formation processes, processing parameters, intentional non-stoichiometric fabrication, deposition tolerance, etc. Reference to only the composition constituents (e.g., SiO, SiN, TiN, etc.) is, therefore, intended to refer to all suitable stoichiometric ratios for the identified composition.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a plurality of vertical fins with a hardmask cap on each fin is shown, in accordance with an embodiment of the present invention.

In one or more embodiments, one or more vertical fins 111 can be formed on a substrate 110, where the vertical fins 111 can be formed by a sidewall image transfer (SIT) process.

In various embodiments, the vertical fins 111 can be formed by a double patterning process (e.g., sidewall image transfer (SIT)). In various embodiments, the vertical fins 111 can be etched into the substrate 110 or an epitaxial layer on the substrate by employing a lithographic patterning process, a SIT process, (e.g., self-aligned quadruple patterning (SAQP) or a self-aligned double patterning (SADP)), or epitaxially grown on the substrate.

In one or more embodiments, the SIT process can include forming a hardmask layer on the substrate 110, which can include an epitaxial layer or active surface layer on the substrate, where the hardmask layer can define the location and dimensions of the vertical fin(s) 111 to be formed. The hardmask layer may be patterned and etched to form a hardmask cap 121 for each vertical fin. Patterning and etching of the hardmask into hardmask caps 121 can expose underlying portions of the substrate 110. The underlying portions of the substrate 110 can be removed to form the one or more vertical fin(s) 111.

In one or more embodiments, the hardmask cap(s) 121 can be silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

In one or more embodiments, the vertical fin(s) 111 can have a height in the range of about 30 nm to about 100 nm, or in the range of about 30 nm to about 60 nm, or in the range of about 60 nm to about 100 nm, where a portion of the fin height can be covered by a gate structure.

In one or more embodiments, the vertical fin(s) 111 can have a width in the range of about 5 nm to about 20 nm, or in the range of about 5 nm to about 15 nm, or in the range of about 10 nm to about 15 nm, or in the range of about 10 nm to about 20 nm. In one or more embodiments, the vertical fin(s) 111 can have a length in the range of about 40 nm to about 600 nm, or in the range of about 40 nm to about 200 nm, or in the range of about 200 nm to about 600 nm, although other lengths are contemplated.

In various embodiments, the distance between adjacent vertical fins 111 can be in the range of about 25 nm to about 80 nm, or in the range of about 25 nm to about 45 nm, or in the range of about 45 nm to about 80 nm. In various embodiments, the smaller distance range between vertical fins 111 can provide for merging source/drains so multiple vertical fins 111 can form a multiple vertical transport FET to enhance device performance. The larger distance range between vertical fins 111 can provide for single vertical fin devices without merged source/drains. Other layers may experience thickness variations with reduced vertical fin distances.

In one or more embodiments, a substrate 110 can be a semiconductor or an insulator, or a combination of semiconductor and insulator with an active surface layer (ASL) made of a semiconductor material. Various portions of the substrate 110 can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe.

In one or more embodiments, the substrate 110 can have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI), where an active surface semiconductor layer of the substrate 110 can be on a substrate insulator layer (e.g., buried oxide layer (BOX)). The substrate 110 can also have other layers forming the substrate, including high-k oxides and/or nitrides. The substrate 110 can also have other device structures such as isolation regions (e.g., shallow trench isolation (STI) regions (not shown)). In one or more embodiments, a substrate insulator layer (e.g., BOX layer) can be formed on at least a portion of a substrate 110.

In various embodiments, the substrate 110 may be a single crystal silicon (Si), silicon-germanium (SiGe), or III-V semiconductor (e.g., GaAs) wafer, or have a single crystal silicon (Si), silicon-germanium (SiGe), or III-V semiconductor (e.g., GaAs) active surface layer. In one or more embodiments, the substrate 110 can be a silicon wafer.

In one or more embodiments, the vertical fin 111 can be formed on the substrate 110, where the vertical fin can be a strained vertical fin made of a semiconductor material. The vertical fin 111 can have a tensile or compressive strain.

Figure 2:
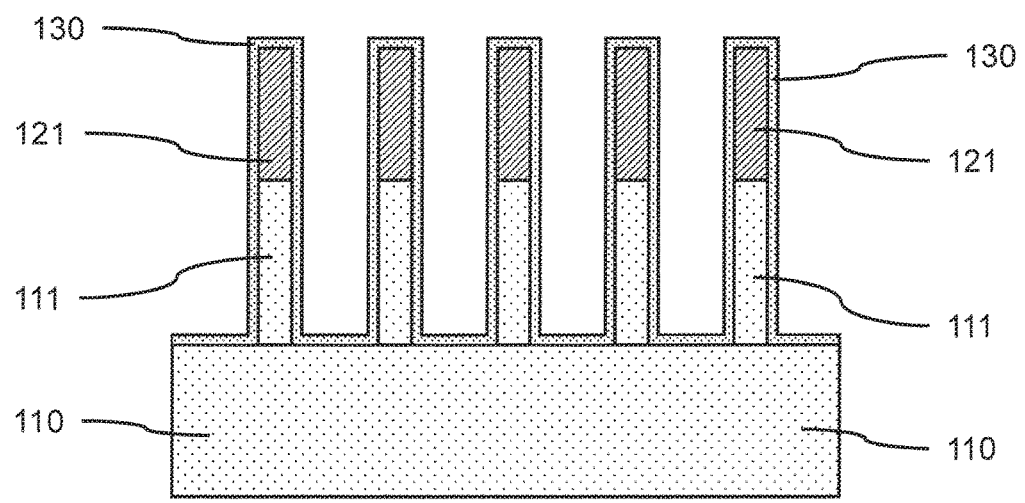
FIG. 2 is a cross-sectional side view showing a shield layer formed on the exposed substrate surface, sidewalls and end faces of the vertical fin(s), and the hardmask cap on each vertical fin, in accordance with an embodiment of the present invention.

FIG. 2 is a cross-sectional side view showing a shield layer formed on the exposed substrate surface, sidewalls and end faces of the vertical fin(s), and the hardmask cap on each vertical fin, in accordance with an embodiment of the present invention.

In one or more embodiments, a shield layer 130 can be formed on the sidewalls and end faces of the vertical fin(s) 111, as well as exposed portions of the substrate 110 and hardmask cap 121, where the shield layer 130 can be formed, for example, by in situ steam generation (ISSG), and the shield layer 130 can be a silicon oxide (e.g., $SiO_2$).

The shield layer 130 can be used to remove damage from the etched surfaces and/or trim the vertical fin(s) 111 to adjust the fin dimensions.

Figure 3:
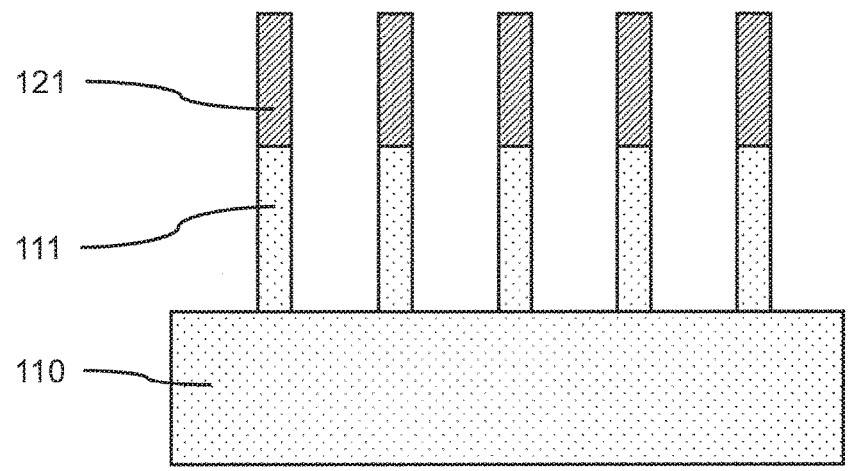
FIG. 3 is a cross-sectional side view showing the vertical fin(s) and the hardmask cap(s) on the substrate after removal of the shield layer, in accordance with an embodiment of the present invention.

FIG. 3 is a cross-sectional side view showing the vertical fin(s) and the hardmask cap(s) on the substrate after removal of the shield layer, in accordance with an embodiment of the present invention.

In one or more embodiments, the shield layer 130 can be removed, for example, using an isotropic etch, to expose the sidewalls and end faces of the vertical fin(s) 111, as well as the substrate surface and hardmask cap(s) 121.

Figure 4:
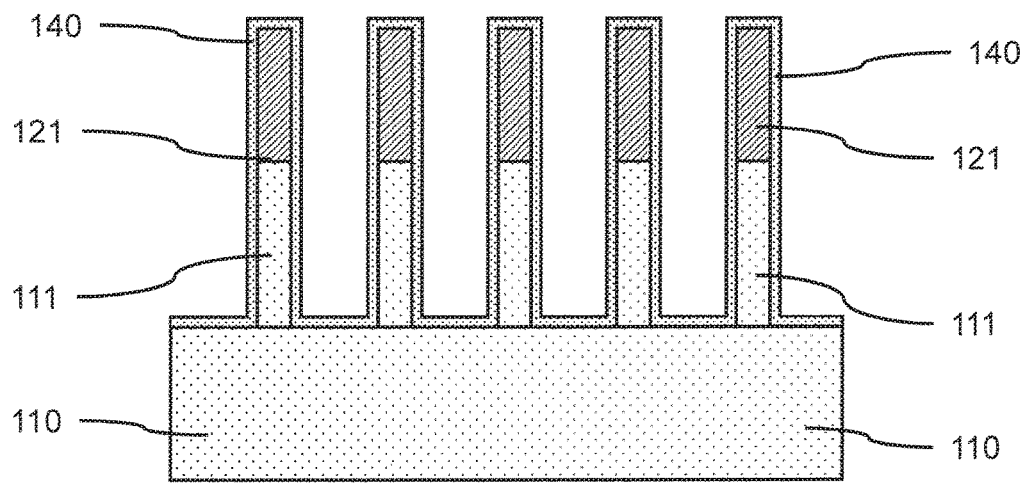
FIG. 4 is a cross-sectional side view showing a dielectric cover on the vertical fin(s) and the hardmask cap(s), in accordance with an embodiment of the present invention.

FIG. 4 is a cross-sectional side view showing a dielectric cover on the vertical fin(s) and the hardmask cap(s), in accordance with an embodiment of the present invention.

In one or more embodiments, a dielectric cover 140 can be formed on the vertical fin(s) 111 and the hardmask cap(s) 121 to protect the vertical fin(s) during subsequent processing.

In various embodiments, the dielectric cover 140 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the dielectric cover 140 can be a different material from the hardmask cap(s) 121 to allow selective removal.

In a non-limiting exemplary embodiment, the dielectric cover 140 can be silicon oxide (SiO) formed by a conformal deposition (e.g., ALD, PEALD) to have a predefined thickness on the sidewalls and end faces of the vertical fin(s) 111. The thickness of the dielectric cover 140 can define a distance from the base of a vertical fin 111 that a dopant can be implanted into the substrate to form a source/drain region.

In one or more embodiments, the dielectric cover 140 can have a thickness in the range of about 20 Å to about 100 Å, or in the range of about 40 Å to about 80 Å, or in the range of about 50 Å to about 60 Å, although other thicknesses are contemplated.

Figure 5:
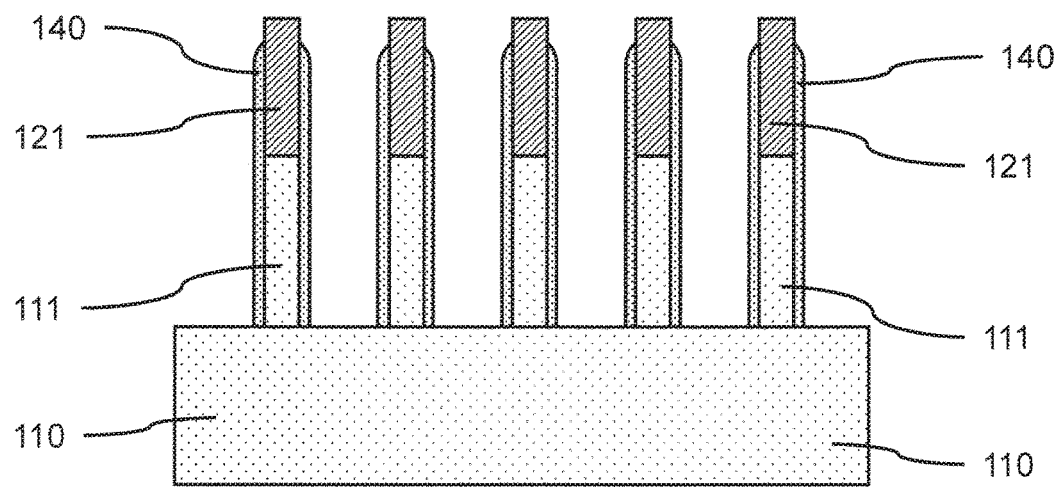
FIG. 5 is a cross-sectional side view showing the dielectric cover removed from the exposed surfaces of the substrate, while remaining on the sidewalls and end faces of the vertical fin(s) and hardmask cap(s), in accordance with an embodiment of the present invention.

FIG. 5 is a cross-sectional side view showing the dielectric cover removed from the exposed surfaces of the substrate, while remaining on the sidewalls and end faces of the vertical fin(s) and hardmask cap(s), in accordance with an embodiment of the present invention.

In one or more embodiments, the portion of the dielectric cover 140 can be removed from portions of the substrate surface to expose at least the substrate portions between and/or around the one or more vertical fin(s) 111 for subsequent formation of source/drain region(s). The portions of the dielectric cover 140 can be removed, for example, by an etch-back process using a directional etching process (e.g., reactive ion etching (RIE)), while leaving a portion of the dielectric cover 140 on the vertical fin(s) 111 and hardmask cap(s) 121. A portion of the dielectric cover 140 on the hardmask cap(s) 121 may be removed at least from the surfaces perpendicular to an impinging ion beam, where the tops of the hardmask cap(s) can become exposed.

Figure 6:
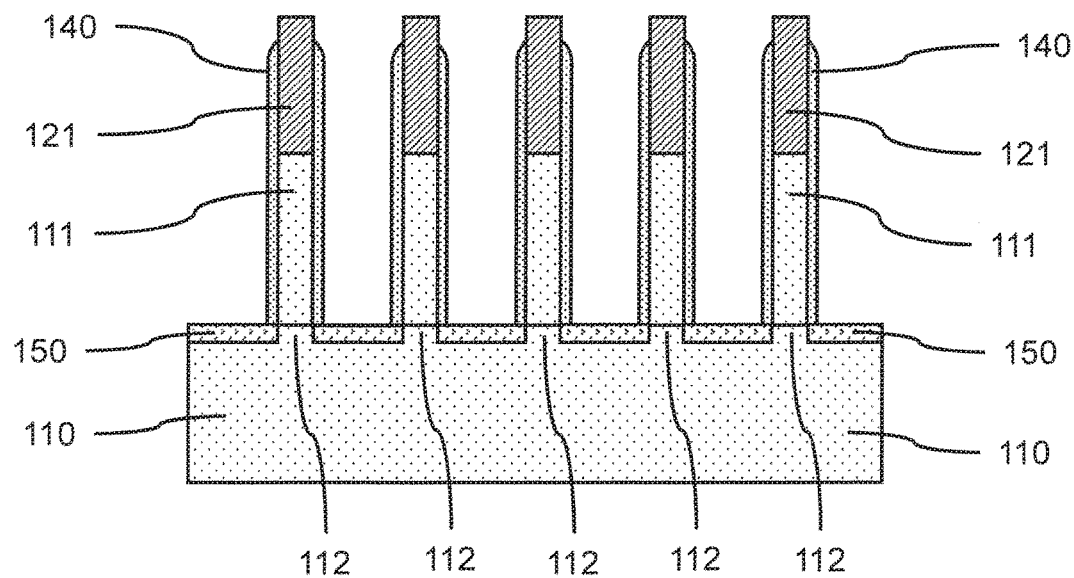
FIG. 6 is a cross-sectional side view showing source/drain regions formed at the surface of the substrate adjacent to the vertical fins, in accordance with an embodiment of the present invention.

FIG. 6 is a cross-sectional side view showing source/drain regions formed at the surface of the substrate adjacent to the vertical fins, in accordance with an embodiment of the present invention.

In one or more embodiments, source/drain regions 150 can be formed adjacent to the vertical fin(s) 111, where the source/drain regions 150 can be formed in a portion of the substrate surface. In various embodiments, n-type or p-type dopants can be implanted into portions of the substrate around and/or between each vertical fin 111. Dopants can be incorporated during epitaxy (e.g., by in-situ epitaxy) of a surface layer on the substrate (e.g., an SiGe layer) or ex situ, where the incorporation can be by any suitable doping techniques, including but not limited to, ion implantation, gas phase doping, plasma doping, plasma immersion ion implantation, cluster doping, infusion doping, liquid phase doping, solid phase doping, etc. In various embodiments, the source/drain regions 150 can be doped to form n-type or p-type source/drains to fabricate NFETs or PFETs. In various embodiments, the source/drain region(s) 150 can be formed into the substrate surface to a depth below the base of the vertical fin(s) 111, where an undoped region may remain after dopant implantation.

In one or more embodiments, the depth of the source/drain region 150 into the surface of the substrate can be in the range of about 20 nm to about 60 nm, or in the range of about 25 nm to about 35 nm, although other depths are contemplated.

In various embodiments, the depth of the source/drain region 150 into the surface of the substrate can be sufficient to avoid an excessive increase in the resistance of the source/drain region 150 that would reduce device performance.

In various embodiments, there can be an undoped gap 112 in the substrate surface below the vertical fin(s) 111 between portions of the source/drain regions 150. The width and length of the undoped gap 112 can be greater than the width and length of the vertical fin 111 by about twice the thickness of the dielectric cover 140, where the dielectric cover 140 can shadow a portion of the substrate directly adjacent to the vertical fin. An undoped gap 112 can be under each of the vertical fin(s) 111.

Figure 7:
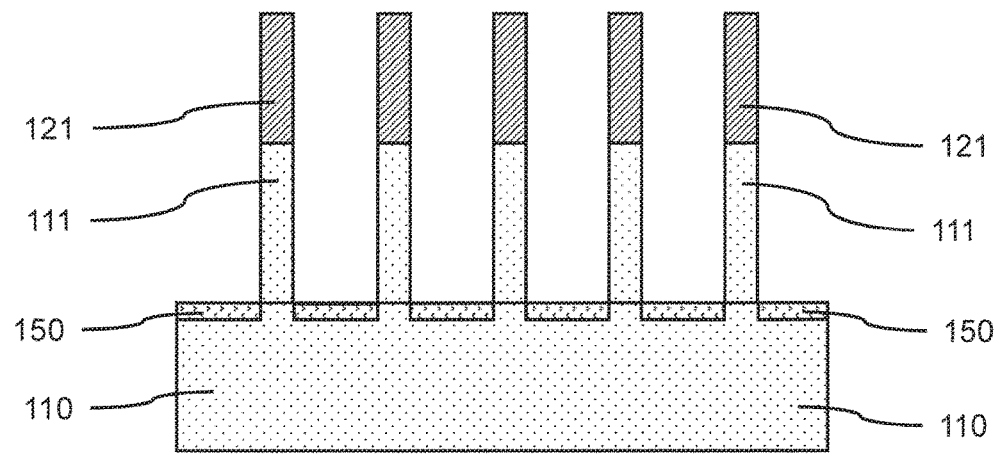
FIG. 7 is a cross-sectional side view showing source/drain regions formed at the surface of the substrate adjacent to the vertical fins after removal of the dielectric cover, in accordance with an embodiment of the present invention.

FIG. 7 is a cross-sectional side view showing source/drain regions formed at the surface of the substrate adjacent to the vertical fins after removal of the dielectric cover, in accordance with an embodiment of the present invention.

In one or more embodiments, the dielectric cover 140 can be removed from the vertical fin(s) 111, where the dielectric cover 140 may be removed after formation of the source/drain region(s) 150. In various embodiments, the dielectric cover 140 can be removed by a non-directional isotropic etch selective for the material of the dielectric cover 140.

Figure 8:
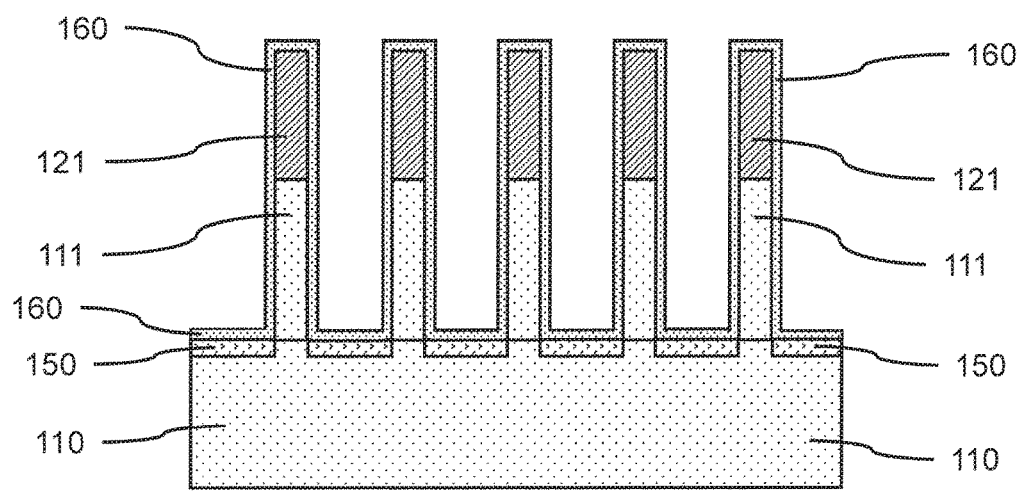
FIG. 8 is a cross-sectional side view showing a fin liner on the sidewalls of the vertical fins, in accordance with an embodiment of the present invention.

FIG. 8 is a cross-sectional side view showing a fin liner on the sidewalls of the vertical fins, in accordance with an embodiment of the present invention.

In one or more embodiments, an fin liner 160 can be formed on the one or more vertical fin(s) 111, where the fin liner 160 can be formed on the sidewalls and end faces of the vertical fin(s) by a conformal deposition (e.g., ALD, PEALD, etc.). The fin liner 160 can also cover the exposed portion of the substrate 110 including source/drain region(s) 150.

In one or more embodiments, the fin liner 160 can be an oxide or a carbide, for example, silicon oxide (SiO), silicon carbide (SiC), silicon borocarbide (SiBC), boron carbide (BC), or a combination thereof, where the fin liner 160 can be selectively removed relative to a bottom spacer and/or the hardmask cap(s) 121.

In one or more embodiments, the fin liner 160 can have a thickness in the range of about 5 Å to about 20 Å, or about 8 Å to about 15 Å, or about 10 Å.

In a non-limiting exemplary embodiments, the fin liner 160 can be silicon dioxide ($SiO_2$) having a thickness of about 10 Å.

Figure 9:
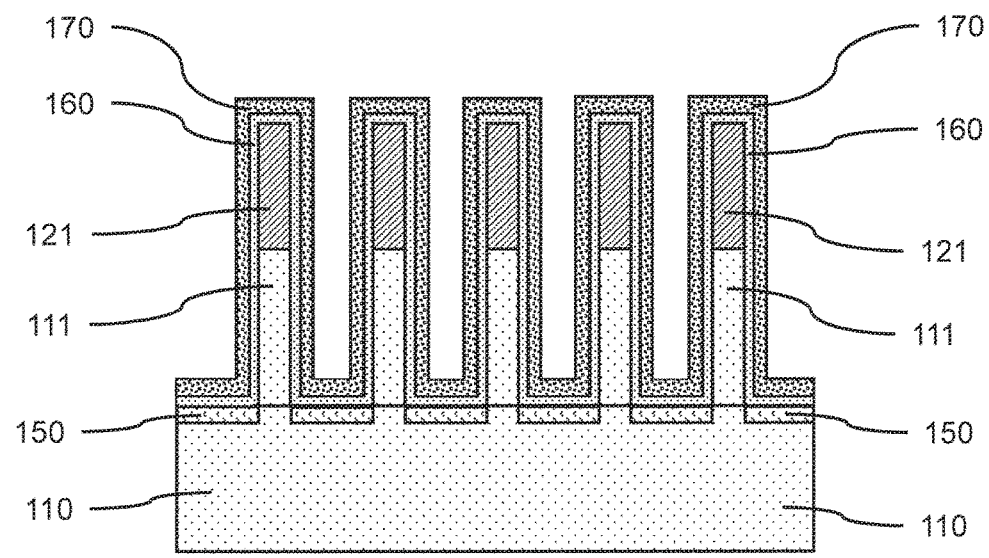
FIG. 9 is a cross-sectional side view showing a sacrificial liner on the fin liner, in accordance with an embodiment of the present invention.

FIG. 9 is a cross-sectional side view showing a sacrificial liner on the fin liner, in accordance with an embodiment of the present invention.

In one or more embodiments, a sacrificial liner 170 can be formed on the fin liner 160, such that the fin liner 160 is an inner liner and the sacrificial liner 170 is an outer liner. In various embodiments, the sacrificial liner 170 can be formed by a conformal deposition (e.g., ALD, PEALD) on the exposed surfaces.

In one or more embodiments, the sacrificial liner 170 can have a thickness in the range of about 5 Å to about 50 Å, or about 10 Å to about 30 Å, or about 20 Å, where the sacrificial liner 170 can be sufficiently thick to prevent nitridation of the underlying fin liner 160. The sacrificial liner 170 can be thicker than the fin liner 160.

In one or more embodiments, the sacrificial liner 170 can be germanium oxide (e.g., $GeO_2$), aluminum oxide (e.g., $Al_2O_3$), lanthanum oxide (e.g., $La_2O_3$), or combinations thereof, where the sacrificial liner 170 can react with a nitriding species during formation of a bottom spacer. In a non-limiting exemplary embodiment, the germanium oxide (GeO) can react to form a germanium oxynitride (GeON).

In various embodiments, the fin liner 160 and sacrificial liner 170 can form a bilayer protective liner, where the fin liner 160 is an inner liner that can be directly on the sidewalls and end faces of a vertical fin 111, and the sacrificial liner 170 can be an outer liner on the fin liner 160, where the surface of the outer sacrificial liner 170 could be exposed to the processing environment, for example, a nitriding atmosphere and/or plasma.

In a non-limiting exemplary embodiment, the bilayer protective liner can include a silicon dioxide ($SiO_2$) fin liner 160 having a thickness of about 10 Å, and a germanium dioxide ($GeO_2$) sacrificial liner 170 having a thickness of about 20 Å on the fin liner 160.

Figure 10:
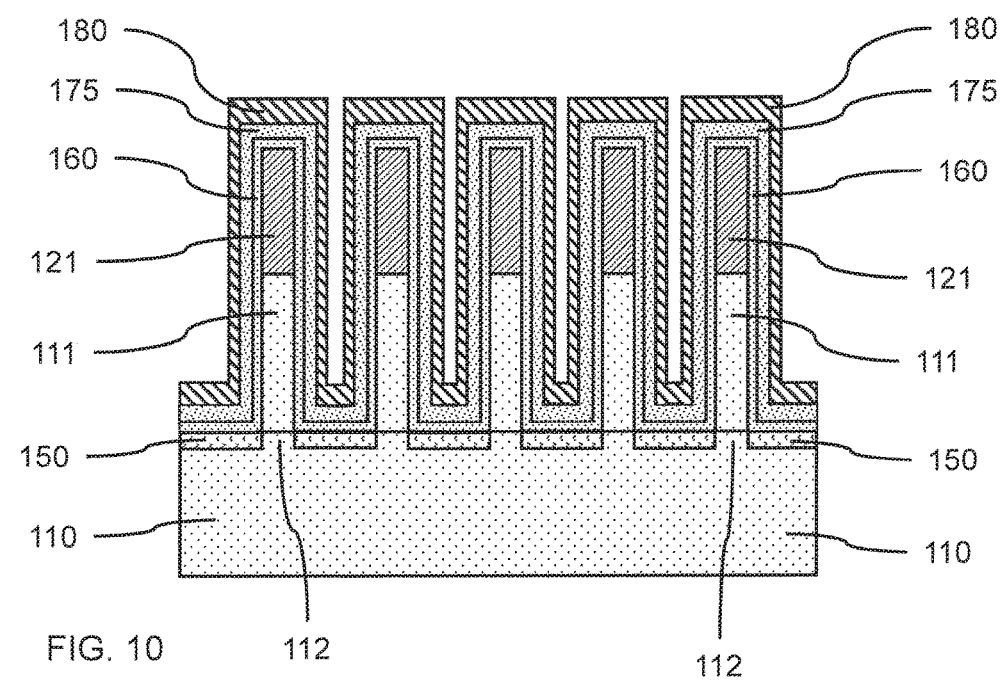
FIG. 10 is a cross-sectional side view showing a bottom spacer layer formed on the sacrificial liner, where the sacrificial liner has been partially converted to an oxynitride, in accordance with an embodiment of the present invention.

FIG. 10 is a cross-sectional side view showing a bottom spacer layer formed on the sacrificial liner, where the sacrificial liner has been partially converted to an oxynitride, in accordance with an embodiment of the present invention.

In one or more embodiments, a bottom spacer layer 180 can be formed on the sacrificial liner 170, where the bottom spacer layer 180 can be directionally deposited, for example by a high-density plasma (HDP) deposition, a gas cluster ion beam deposition (GCIB) or PVD, where the bottom spacer layer can have a greater thickness on surfaces substantially perpendicular to the incident deposition species (horizontal surfaces as illustrated), and a lesser thickness on surfaces substantially parallel to the incident deposition species (vertical surfaces as illustrated).

In one or more embodiments, the bottom spacer layer 180 can be a dielectric nitride compound, including, but not limited to silicon nitride (SiN), a silicon oxynitride (SiON), a silicon carbonitride (SiCN), a silicon boronitride (SiBN), and combinations thereof.

In one or more embodiments, the bottom spacer layer 180 can have a thickness in the range of about 4 nm to about 10 nm, or in the range of about 4 nm to about 6 nm, although other thicknesses are contemplated.

In a non-limiting exemplary embodiment, the bottom spacer layer 180 can be silicon nitride ($Si_3N_4$) formed by a high-density plasma deposition to a thickness of about 10 nm on the horizontal surfaces.

In one or more embodiments, the sacrificial liner 170 can react with the nitriding species forming the bottom spacer layer 180 to convert to an oxynitride layer 175, where the sacrificial layer can scavenge the nitriding species before it can react with the inner fin liner 160. By reacting with nitriding species, the sacrificial liner 170 can prevent the fin liner from becoming an oxynitride (e.g., SiON). In various embodiments, oxynitride layer 175 can have a thickness in the range of about 1 nm to about 3 nm.

In a non-limiting exemplary embodiment, a germanium oxide sacrificial liner 170 can react to form a germanium oxynitride sacrificial layer 175. In various embodiments, the germanium oxynitride sacrificial layer 175 can have a thickness in the range of about 1 nm to about 3 nm.

Figure 11:
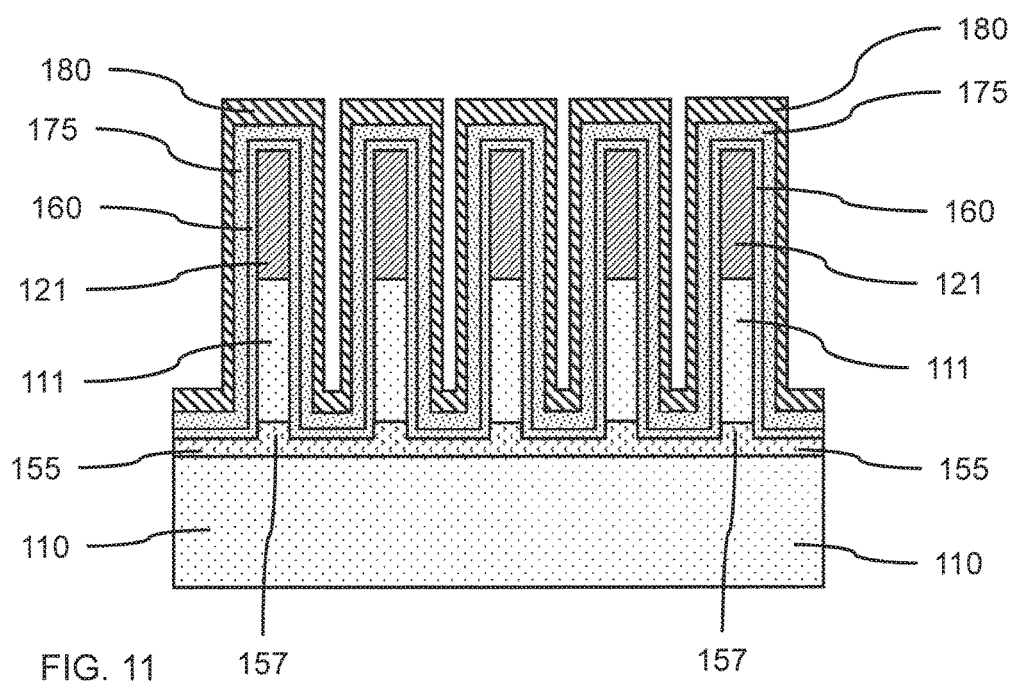
FIG. 11 is a cross-sectional side view showing expansion of the source/drain regions into the regions below the vertical fins, in accordance with an embodiment of the present invention.

FIG. 11 is a cross-sectional side view showing expansion of the source/drain regions into the regions below the vertical fins, in accordance with an embodiment of the present invention.

In one or more embodiments, dopants can be diffused from the source/drain regions 150 into the undoped gap(s) 112 below the vertical fin(s) 111 through a heat treatment (e.g., anneal). The dopants may also diffuse into a lower portion 157 of the vertical fin(s) 111, which can reduce the channel length of the vertical fins. In various embodiments, the heat treatment can also activate the dopants in the source/drain regions 150 to form active bottom source/drains 155 below each of the one or more vertical fin(s) 111. The source/drain regions can have sufficient dopant concentrations for diffusion.

In various embodiments, the active bottom source/drain 155 can span a plurality of vertical fins 111, such that two or more vertical fins 111 can be electrically coupled to become part of the same vertical FinFET device.

In one or more embodiments, the source/drain regions 150 can be heat treated at a temperature in the range of about 900° C. to about 1100° C.

Figure 12:
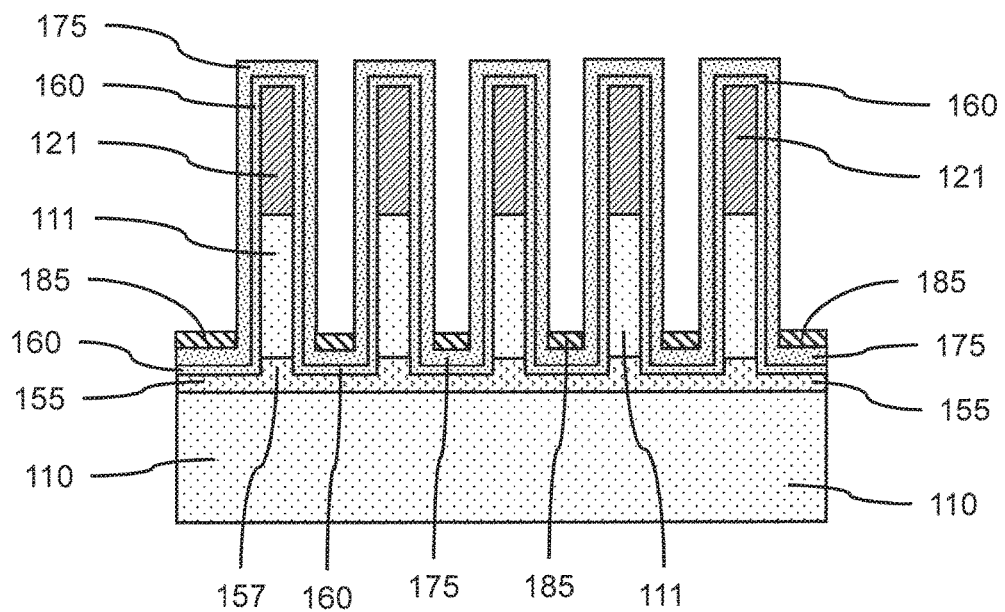
FIG. 12 is a cross-sectional side view showing a portion of the bottom spacer layer removed from the vertical fins and hardmask caps, in accordance with an embodiment of the present invention.

FIG. 12 is a cross-sectional side view showing a portion of the bottom spacer layer removed from the vertical fins and hardmask caps, in accordance with an embodiment of the present invention.

In one or more embodiments, a portion of the bottom spacer layer 180 can be removed to expose the sacrificial oxynitride layer 175 on the sidewalls of the vertical fin(s) 111 and hardmask caps 121, and the top surface of the hardmask cap. A portion of the bottom spacer layer 180 can be removed using a non-directional isotropic etch, such that the lesser thickness of the bottom spacer layer 180 on the perpendicular surfaces would be removed from the bottom spacer layer 180 on the substrate to leave a reduced thickness bottom spacer 185 on portions of the substrate 110. In various embodiments, portions of the bottom spacer layer 180 can be removed using either a SiConi™ etch process (i.e., remote plasma dry etch including $H_2$, $NF_3$, and $NH_3$ plasma by-products) or a hydrogen fluoride etch (e.g., aqueous hydrofluoric acid, hydrogen fluoride gas/plasma). The etch rate of silicon nitride to silicon oxide can be about 5 to 1, whereas the etch rate of silicon nitride to germanium oxynitride can be greater than 100 to 1, such that the sacrificial oxynitride layer 175 remains essentially unetched during removal of the bottom spacer layer 180.

In one or more embodiments, bottom spacers 185 can remain on the sacrificial oxynitride layer 175 on the substrate 110, where a portion of the bottom spacers 185 can be between the vertical fins 111. The sacrificial oxynitride layer 175 can remain on the vertical fins 111 and hardmask caps 121, due to the etch selectivity of the SiConi™ etch or hydrogen fluoride etch for the nitride (e.g., $Si_3N_4$) of the bottom spacer layer.

Figure 13:
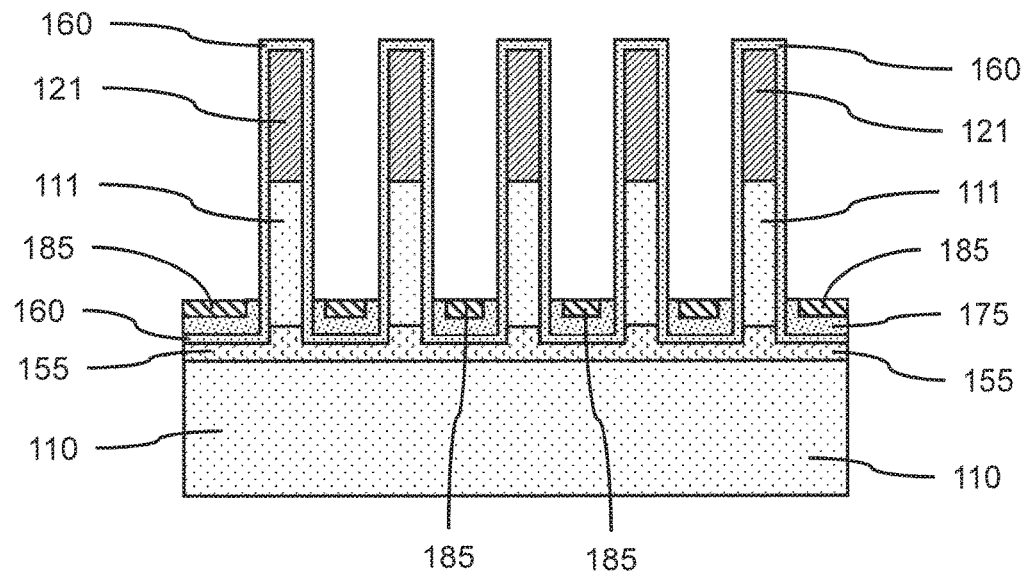
FIG. 13 is a cross-sectional side view showing a portion of the sacrificial oxynitride layer removed from the fin liner, in accordance with an embodiment of the present invention.

FIG. 13 is a cross-sectional side view showing a portion of the sacrificial oxynitride layer removed from the fin liner, in accordance with an embodiment of the present invention.

In one or more embodiments, the exposed portion of the sacrificial oxynitride layer 175 can be removed to expose the underlying fin liner 160. In various embodiments, the sacrificial oxynitride layer 175 can be removed by a buffered oxide etch (BOE), also referred to as a buffered hydrogen fluoride etch (BHF), where the sacrificial oxynitride layer 175 can be selectively removed over the nitride of the bottom spacers. In this manner, the thickness of the bottom spacers can be maintained.

In a non-limiting exemplary embodiment, an approximately 20 Å germanium oxynitride layer (GeON) can be removed from a silicon dioxide ($SiO_2$) fin liner 160 using a BOE with minimum change to the thickness of the bottom spacers 185.

Figure 14:
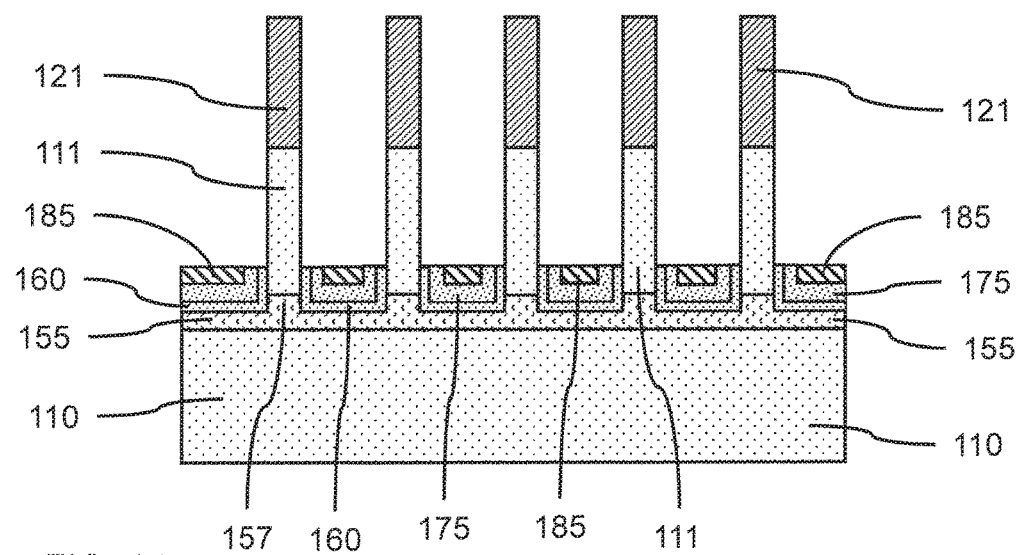
FIG. 14 is a cross-sectional side view showing a portion of the fin liner removed from the sidewalls of the vertical fins, in accordance with an embodiment of the present invention.

FIG. 14 is a cross-sectional side view showing a portion of the fin liner removed from the sidewalls of the vertical fins, in accordance with an embodiment of the present invention.

In one or more embodiments, the fin liner 160 may also be removed from the vertical fins 111 and hardmask caps 121 using the same BOE used to remove the sacrificial oxynitride layer 175. Removal of both the sacrificial oxynitride layer 175 and fin liner 160 can expose the vertical fins 111 and hardmask fin caps 121.

In various embodiments, portions of the fin liner 160 and sacrificial oxynitride layer 175 can remain on the source/drains 185 at the surface of the substrate 110 and on the lower portions 157 of the vertical fins 111.

Figure 15:
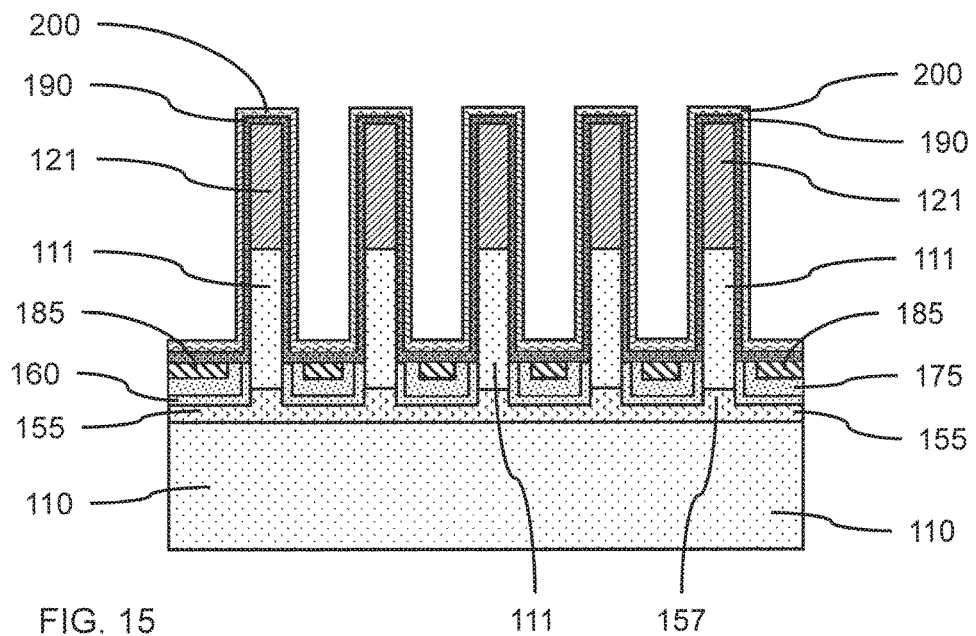
FIG. 15 is a cross-sectional side view showing an insulating liner formed on the sidewalls of the vertical fins, and a gate dielectric layer formed on the insulating liner, in accordance with an embodiment of the present invention.

FIG. 15 is a cross-sectional side view showing an insulating liner formed on the sidewalls of the vertical fins, and a gate dielectric layer formed on the insulating liner, in accordance with an embodiment of the present invention.

In one or more embodiments, an insulating liner 190 can be formed on the vertical fins 111 and hardmask caps 121, where the insulating liner can be formed by a conformal deposition on at least the sidewalls and end faces of the vertical fins 111 and hardmask caps 121. The insulating liner 190 can improve the gate stack properties.

In one or more embodiments, the insulating liner 190 can be silicon oxide (SiO), where the silicon oxide can be formed by ozone oxidation, thermal oxidation, chemical oxidation, plasma oxidation, etc.

In one or more embodiments, the insulating liner 190 can have a thickness in the range of about 3 Å to about 20 Å, or in the range of about 5 Å to about 10 Å.

In one or more embodiments, a gate dielectric layer 200 can be formed on the insulating liner 190 on the vertical fins 111. The gate dielectric layer 200 can be formed by a conformal deposition (e.g., ALD, PEALD).

In various embodiments, the gate dielectric layer 200 can include silicon oxide (SiO), silicon nitride (SiN), silicon oxynitride (SiON), boron nitride (BN), high-k dielectric materials, or any combination of these materials. Examples of high-k dielectric materials include, but are not limited to, metal oxides such as hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material can further include dopants such as lanthanum (La) and aluminum (Al).

In one or more embodiments, the gate dielectric layer 200 can have a thickness in the range of about 5 Å to about 100 Å, or in the range of about 20 Å to about 50 Å.

Figure 16:
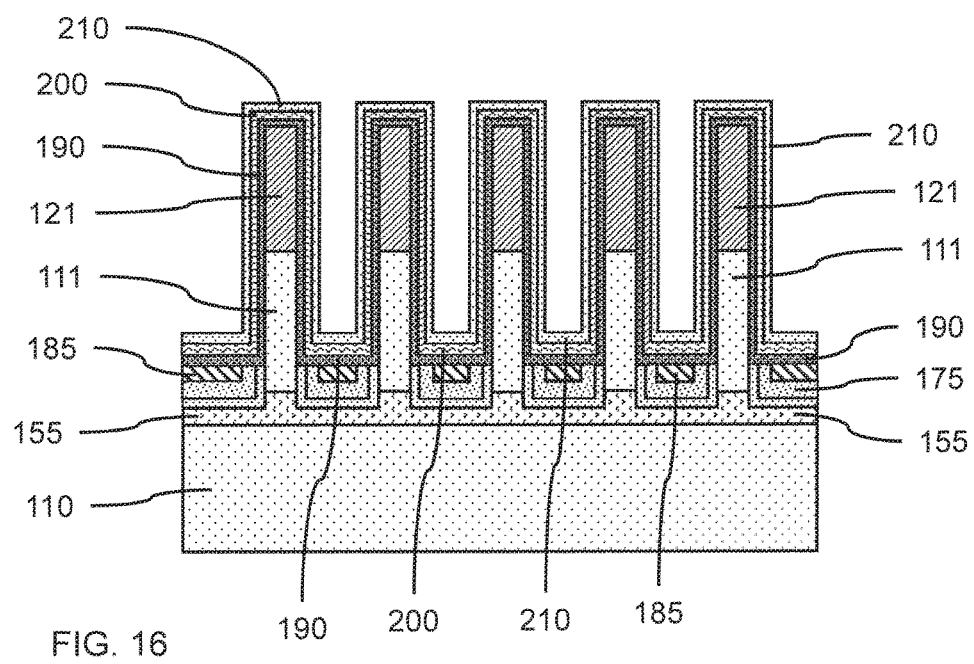
FIG. 16 is a cross-sectional side view showing a work function layer formed on the gate dielectric layer, in accordance with an embodiment of the present invention.

FIG. 16 is a cross-sectional side view showing a work function layer formed on the gate dielectric layer, in accordance with an embodiment of the present invention.

In one or more embodiments, a work function layer 210 can be formed on the gate dielectric layer 200 on at least a portion of the vertical fins 111. The work function layer 210 can be formed by a conformal deposition (e.g., ALD, PEALD).

In various embodiments, the work function layer 210 can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Figure 17:
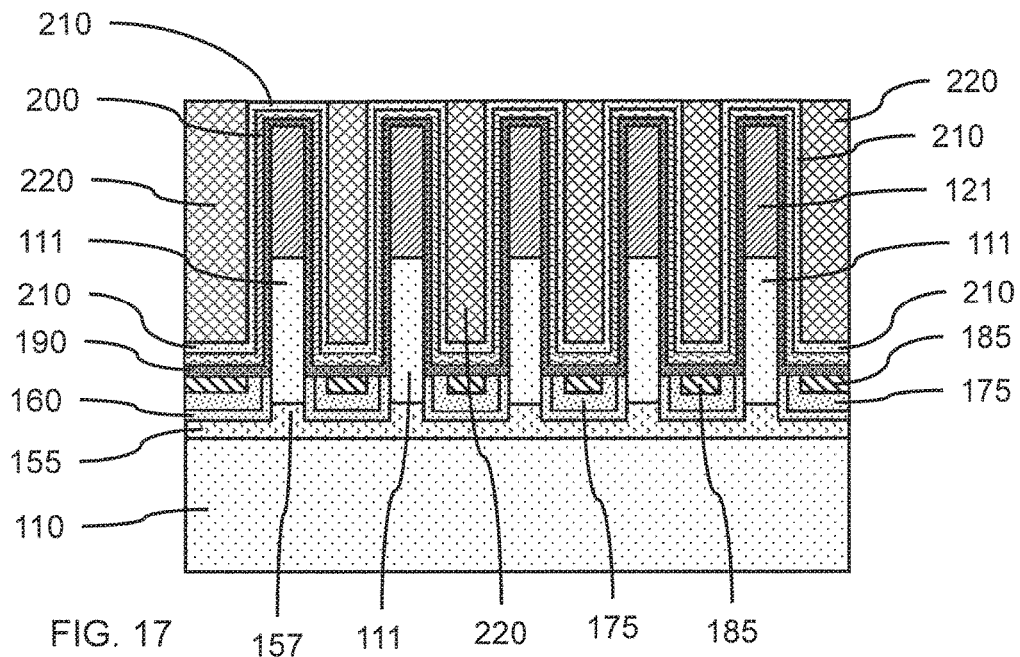
FIG. 17 is a cross-sectional side view showing a conductive gate fill layer formed on the work function layer and gate dielectric layer, in accordance with an embodiment of the present invention.

FIG. 17 is a cross-sectional side view showing a conductive gate fill layer formed on the work function layer and gate dielectric layer, in accordance with an embodiment of the present invention.

In one or more embodiments, a conductive gate fill layer 220 can be formed in the remaining spaces between and around the vertical fins 111 after formation of the gate dielectric layer 200 and work function layer 210. In various embodiments, a gate structure can include the gate dielectric layer 200 formed on at least a portion of the insulating liner 190 and the vertical fin 111, and a conductive gate electrode including a conductive gate fill layer 220 and optionally a work function layer 210 between the gate dielectric layer 200 and the conductive gate fill layer 220.

In various embodiments, the conductive gate fill layer 220 can be blanket deposited to fill the spaces between the vertical fins 111, where the conductive gate fill layer 220 can extend above the top surfaces of the work function layer 210 and/or gate dielectric layer 200 on the hardmask caps 121.

In various embodiments, the conductive gate fill layer 220 material can include doped polycrystalline silicon (p-Si) or amorphous silicon (a-Si), germanium (Ge), silicon-germanium (SiGe), a metal (e.g., tungsten, titanium, tantalum, ruthenium, zirconium, cobalt, copper, aluminum, lead, platinum, tin, silver, or gold), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO), cobalt silicide (CoSi), or nickel silicide (NiSi)), carbon nanotube(s) (CNTs), conductive carbon, graphene, or any suitable combination of these materials. The conductive gate fill layer material can further include dopants that are incorporated during or after formation (e.g., deposition).

Figure 18:
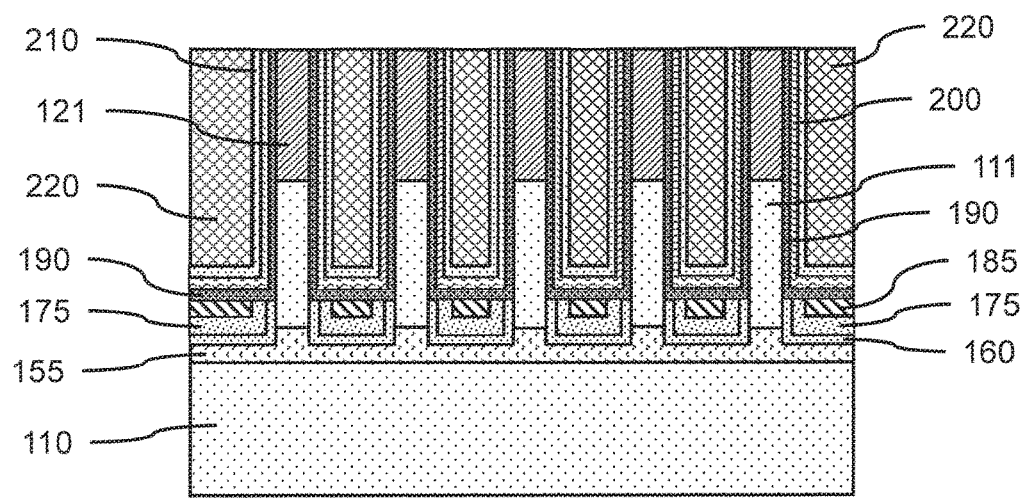
FIG. 18 is a cross-sectional side view showing removal of the conductive gate fill layer, work function layer, gate dielectric layer, and insulating liner from the top surface of the hardmask caps, in accordance with an embodiment of the present invention.

FIG. 18 is a cross-sectional side view showing removal of the conductive gate fill layer, work function layer, gate dielectric layer, and insulating liner from the top surface of the hardmask caps, in accordance with an embodiment of the present invention.

In one or more embodiments, a CMP can be used to remove a portion of the conductive gate fill layer 220, work function layer 210, gate dielectric layer 200, and insulating liner 190 extending above the top surface of the hardmask caps 121 to provide a smooth, flat surface. The hardmask caps 121 can thereby be exposed, while the gate structure remains on the sidewalls of the hardmask caps and vertical fins 111.

Figure 19:
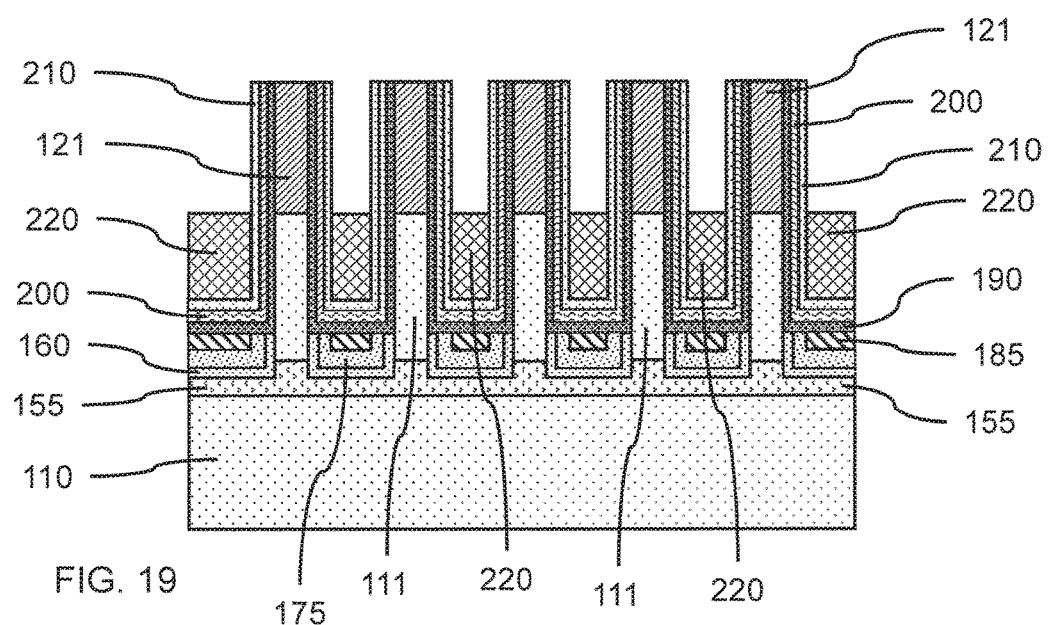
FIG. 19 is a cross-sectional side view showing partial removal of the conductive gate fill layer, in accordance with an embodiment of the present invention.

FIG. 19 is a cross-sectional side view showing partial removal of the conductive gate fill layer, in accordance with an embodiment of the present invention.

In one or more embodiments, a portion of the conductive gate fill layer 220 can be selectively removed to reduce the height of the conductive gate fill layer 220, and thereby the gate structure on the vertical fins 111. The height of the conductive gate fill layer 220 may be reduced to or below the level of the top surface of the vertical fin(s) 111, where the height of the conductive gate fill layer 220 may define a gate length on the channel formed by the vertical fin 111.

Figure 20:
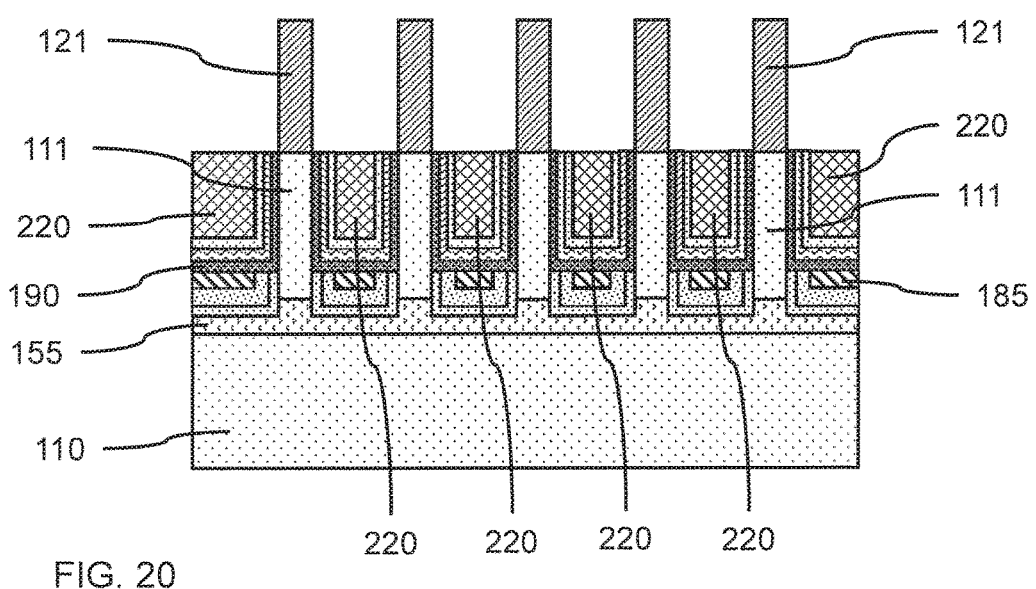
FIG. 20 is a cross-sectional side view showing partial removal of the work function layer, gate dielectric layer, and insulating liner from the side surface of the hardmask caps, in accordance with an embodiment of the present invention.

FIG. 20 is a cross-sectional side view showing partial removal of the work function layer, gate dielectric layer, and insulating liner from the side surface of the hardmask caps, in accordance with an embodiment of the present invention.

In one or more embodiments, a portion of the work function layer 210, gate dielectric layer 200, and insulating liner 190 can be selectively removed to reduce the height of the gate structure on the vertical fins. The height of the work function layer 210, gate dielectric layer 200, and insulating liner 190 may be reduced to the level of the top surface of the conductive gate fill layer 220 and/or vertical fin(s) 111, to define a gate length on the channel formed by the vertical fin 111. The work function layer 210, gate dielectric layer 200, and insulating liner 190 can be removed by an isotropic etch, where each layer may be removed by a separate etch.

Figure 21:
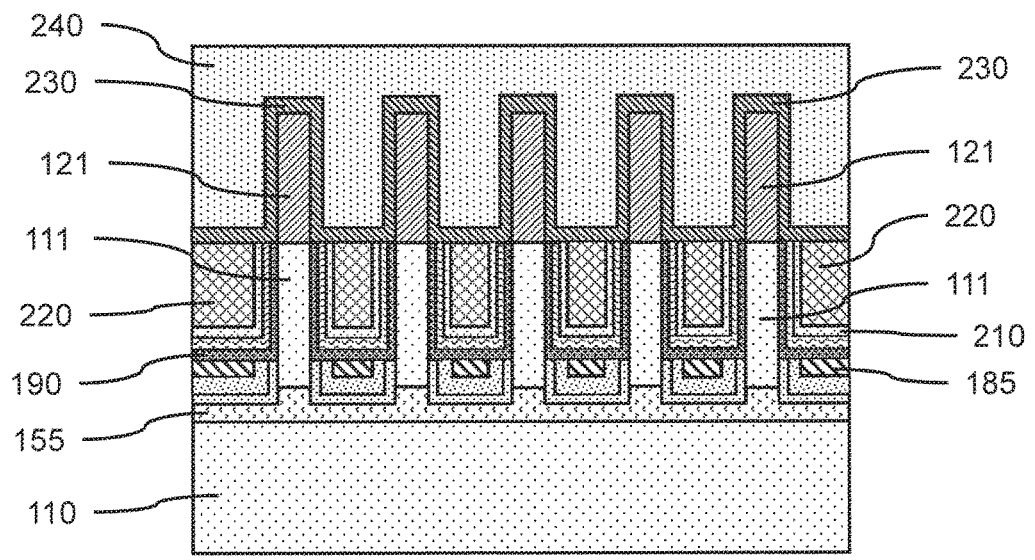
FIG. 21 is a cross-sectional side view showing a top spacer layer and ILD layer formed on the conductive gate fill layer and hardmask caps, in accordance with an embodiment of the present invention.

FIG. 21 is a cross-sectional side view showing a top spacer layer and ILD layer formed on the conductive gate fill layer and hardmask caps, in accordance with an embodiment of the present invention.

In one or more embodiments, a top spacer layer 230 can be formed on the conductive gate fill layer 220 and the hardmask caps 121, where the top spacer layer 230 can be formed by a conformal deposition to control the top spacer layer thickness. The top spacer layer 230 can also cover the exposed edges of the work function layer 210, gate dielectric layer 200, and insulating liner 190.

In one or more embodiments, the top spacer layer 230 can be a silicon boronitride (SiBN), a silicon borocarbide (SiBC), a silicon boro carbonitride (SiBCN), a boron carbide (BC), a boron nitride (BN), or combinations thereof. The top spacer layer 230 can be a different material from the hardmask caps 121, such that the hardmask caps 121 can be selectively removed without removing the adjacent top spacer layer 230.

In one or more embodiments, an interlayer dielectric (ILD) layer 240 can be formed on the top spacer layer 230, where the ILD layer 240 can be formed by a blanket deposition on the top spacer layer.

In various embodiments, the ILD layer 240 can be silicon oxide (SiO), a low-K insulating dielectric, silicon oxynitride (SiON), carbon doped silicon oxide, fluorine doped silicon oxide, boron carbon nitride, hydrogen silsesquioxane polymer (HSQ), methyl silsesquioxane polymer (MSQ), methyl doped silica or $SiOx(CH_3)y$ or $SiC_xO_yH_z$, organosilicate glass (SiCOH), porous SiCOH, and/or combinations thereof. Excess ILD material may be etched back or removed by chemical-mechanical polishing (CMP), where the chemical-mechanical polishing can provide a smooth flat surface.

Figure 22:
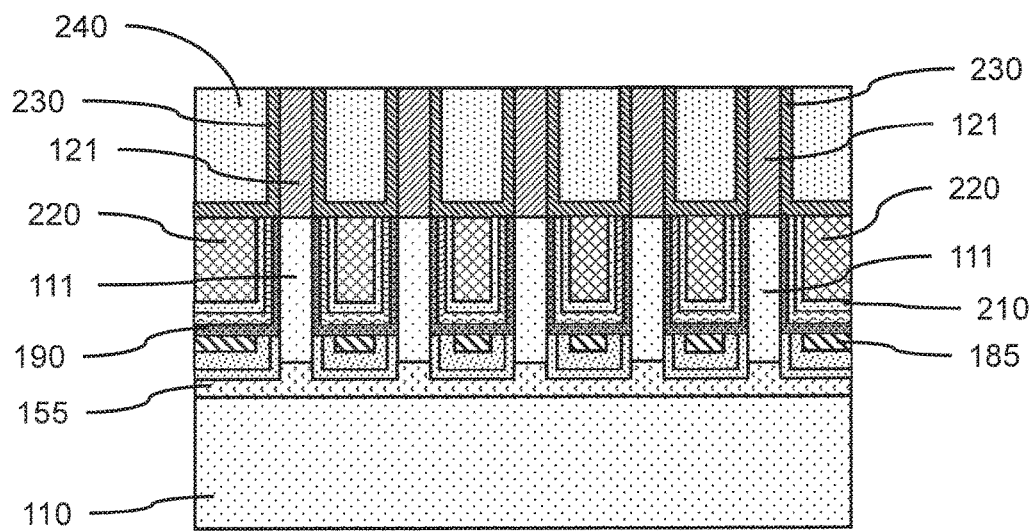
FIG. 22 is a cross-sectional side view showing the partial removal of the top spacer layer and interlayer dielectric (ILD) layer to expose the top surface of the hardmask caps, in accordance with an embodiment of the present invention.

FIG. 22 is a cross-sectional side view showing the partial removal of the top spacer layer and interlayer dielectric (ILD) layer to expose the top surface of the hardmask caps, in accordance with an embodiment of the present invention.

In various embodiments, the portion of the ILD layer 240 and top spacer layer 230 can be removed from the top surface of the hardmask cap(s) 121, where the ILD layer 240 and top spacer layer 230 can be etched back and/or removed using CMP. The top surface of the hardmask cap(s) 121 can, thereby, be exposed.

Figure 23:
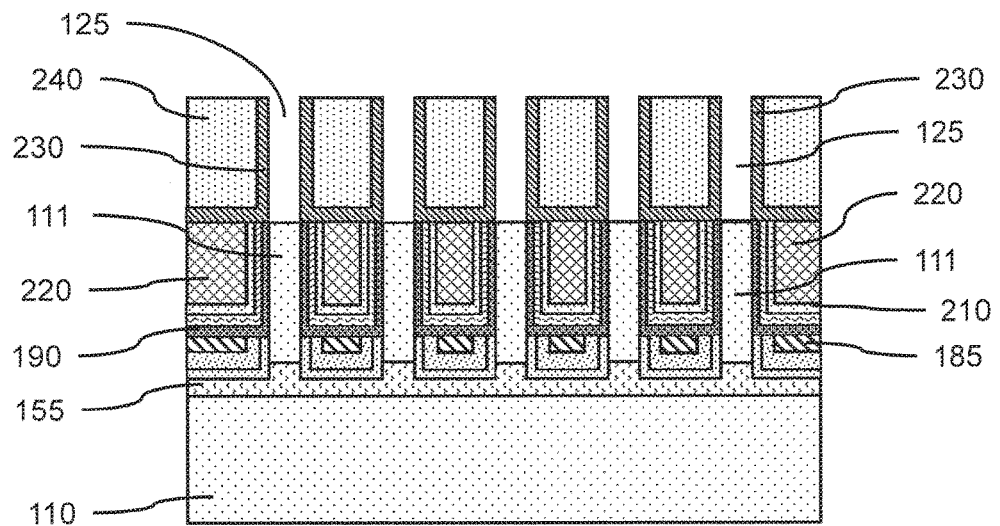
FIG. 23 is a cross-sectional side view showing the removal of the hardmask caps from the vertical fins, in accordance with an embodiment of the present invention.

FIG. 23 is a cross-sectional side view showing the removal of the hardmask caps from the vertical fins, in accordance with an embodiment of the present invention.

In one or more embodiments, the hardmask cap(s) 121 can be selectively removed from the tops of the vertical fin(s) 111, for example, by a selective RIE or wet etch to form openings 125. The top surfaces of the vertical fin(s) 111 can thereby be exposed.

Figure 24:
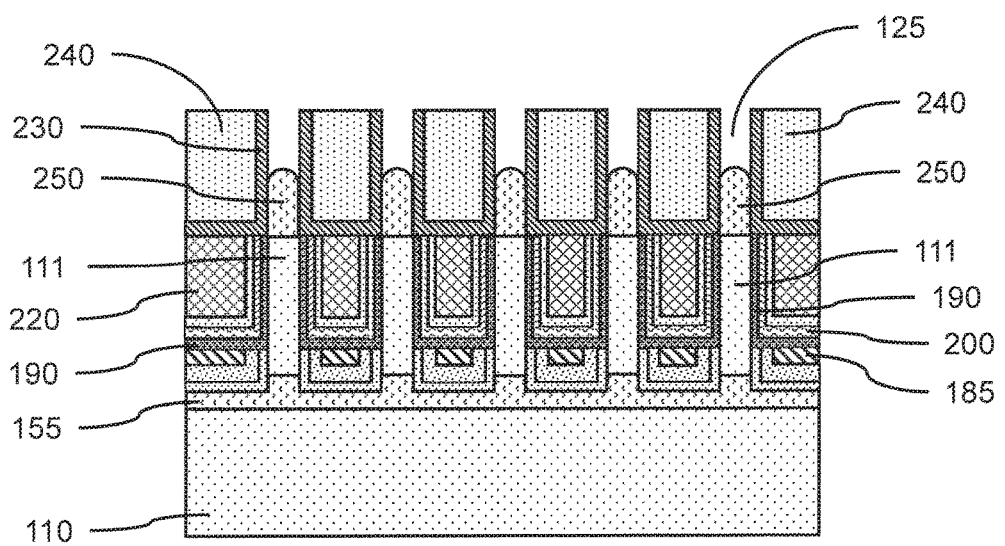
FIG. 24 is a cross-sectional side view showing top source/drains on the vertical fins, in accordance with an embodiment of the present invention.

FIG. 24 is a cross-sectional side view showing top source/drains on the vertical fins, in accordance with an embodiment of the present invention.

In one or more embodiments, top source/drains 250 can be formed on the top surfaces of the vertical fins 111, where the top source/drains 250 can be epitaxially grown on crystalline vertical fins. The top surfaces of the vertical fins can have a predetermined crystal face. The top source/drains 250 can be formed with a predetermined crystal orientation based on the exposed crystal face of the vertical fin 111.

In one or more embodiments, the top source/drain(s) 250 can be in-situ doped (where doping and epitaxy growth are performed at the same time), and/or ex-situ doped (where doping occurs before and/or after epitaxy). Dopants can be incorporated during epitaxy (e.g., by in-situ epitaxy) or by any other suitable doping techniques, including but not limited to, ion implantation, gas phase doping, plasma doping, plasma immersion ion implantation, cluster doping, infusion doping, liquid phase doping, solid phase doping, etc. In various embodiments, the source/drains 250 can be doped to form n-type or p-type source/drains to fabricate NFETs or PFETs. Although the top surface of the source/drain(s) 250 are depicted as below the top surface of the ILD layer 240 and top spacer layer 230 the top source/drains 250 can also be coplanar with, in between, or above the top surface of the ILD layer 240 depending on the extent of the epitaxial growth. The top source/drains 250 can be formed in openings 125.

Figure 25:
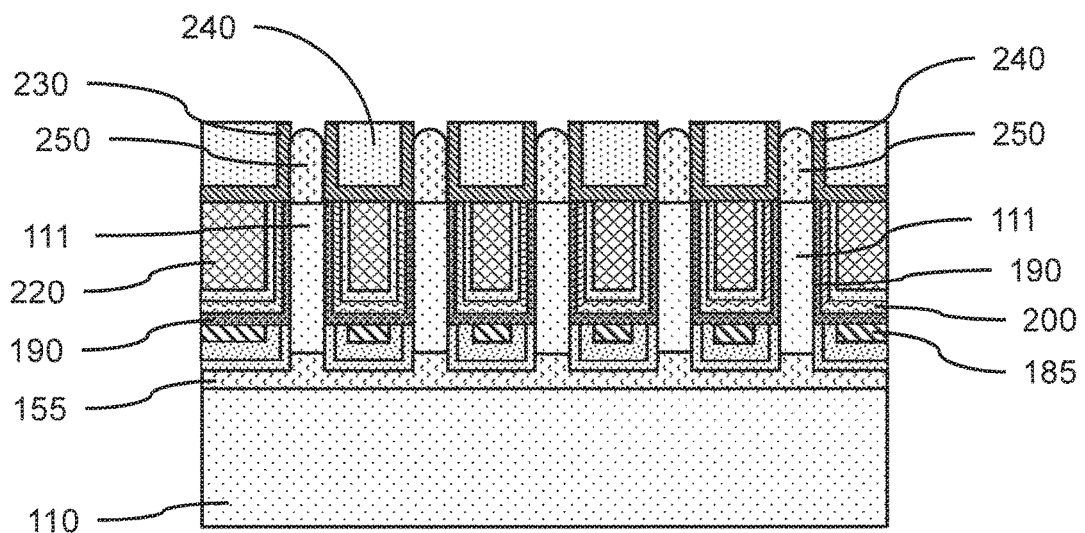
FIG. 25 is a cross-sectional side view showing ILD layer and top spacer layer with a reduced height, in accordance with an embodiment of the present invention.

FIG. 25 is a cross-sectional side view showing ILD layer and top spacer layer with a reduced height, in accordance with an embodiment of the present invention.

In one or more embodiments, a portion of the ILD layer 240 and top spacer layer 230 can be removed to reduce the height to approximately the level of the top source/drains 250. In various embodiments, the height of the ILD layer 240 and top spacer layer 230 can be reduced using CMP.

Figure 26:
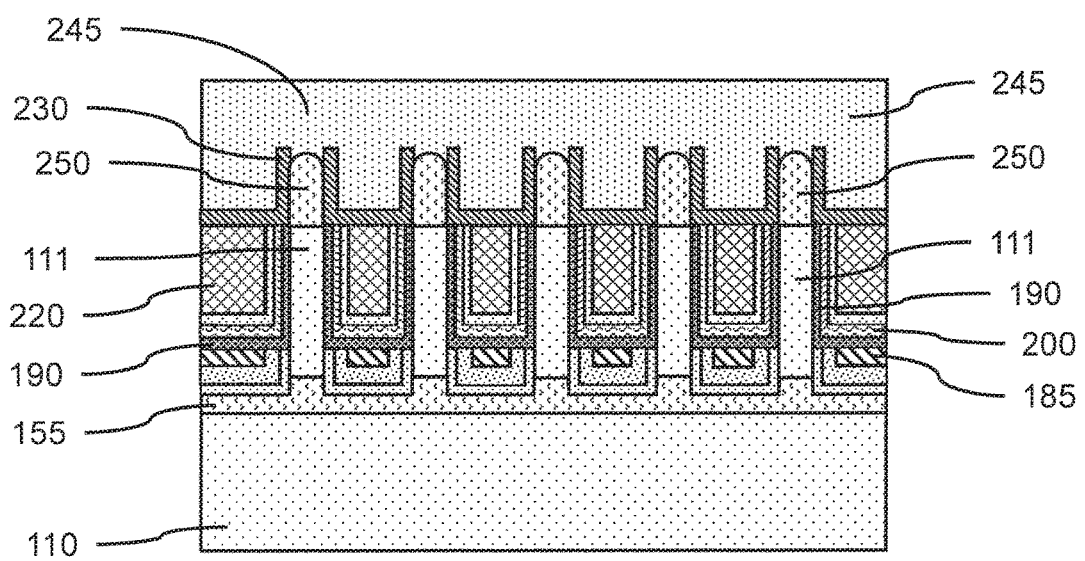
FIG. 26 is a cross-sectional side view showing an additional ILD layer formed on the top spacer layer and top source/drains, in accordance with an embodiment of the present invention.

FIG. 26 is a cross-sectional side view showing an additional ILD layer formed on the top spacer layer and top source/drains, in accordance with an embodiment of the present invention.

In one or more embodiments, an additional ILD layer 245 can be formed on the ILD layer 240 already present, and on the top source/drains 250 and exposed portions of the top spacer layer 230, prior to conducting back end of line (BEOL) processes to form electrical connections to the top source/drains 250, bottom source/drains 155, and gate electrodes. Formation of the additional ILD layer 245 can provide a thicker ILD layer on the FinFET device components.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural tonus as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims:

What is claimed is:

1. A method of forming a vertical fin field effect transistor device, comprising:
   forming one or more vertical fins with a hardmask cap on each vertical fin on a substrate;
   forming a fin liner on the sidewalls of the one or more vertical fins and hardmask caps;
   forming a sacrificial liner on the fin liner, wherein the sacrificial liner is a material that reacts with a nitriding species; and
   forming a bottom spacer layer on the sacrificial liner, wherein the bottom spacer layer is formed using a nitriding species that reacts with the sacrificial liner.

2. The method of claim 1, wherein the sacrificial liner is germanium oxide.

3. The method of claim 2, wherein the sacrificial liner has a thickness in the range of about 5 Å to about 50 Å.

4. The method of claim 2, wherein the fin liner is silicon oxide.

5. The method of claim 2, wherein the bottom spacer layer is formed by a high-density plasma (HDP) deposition.

6. The method of claim 5, wherein the bottom spacer layer is silicon nitride.

7. The method of claim 5, wherein the high-density plasma (HDP) deposition converts at least a portion of the germanium oxide to germanium oxynitride.

8. The method of claim 1, further comprising forming one or more source/drain regions at the surface of the substrate, and heat treating the source/drain regions to form active bottom source/drains.

9. The method of claim 8, further comprising removing a portion of the bottom spacer layer after heat treating the source/drain regions to form active bottom source/drains.

10. The method of claim 9, further comprising removing an exposed portion of the reacted sacrificial liner after removing a portion of the bottom spacer layer.

11. A method of forming a vertical fin field effect transistor device, comprising:

forming a plurality of vertical fins with a hardmask cap on each vertical fin on a substrate;

forming a silicon oxide fin liner on the sidewalls of the plurality of vertical fins and hardmask caps;

forming a germanium oxide sacrificial liner on the fin liner; and forming a silicon nitride bottom spacer layer on the sacrificial liner, wherein the silicon nitride bottom spacer layer is formed by a high-density plasma (HDP) deposition.

12. The method of claim 11, further comprising forming a bottom source/drain below each of the plurality of vertical fins, and removing a portion of the bottom spacer layer to form bottom spacers adjacent to each of the plurality of vertical fins.

13. The method of claim 12, further comprising forming a gate structure on each of the plurality of vertical fins, where each gate structure is on at least one bottom spacer.

14. The method of claim 13, further comprising removing the hardmask cap from each of the plurality of vertical fins, and forming a top source/drain on each of the plurality of vertical fins.

15. The method of claim 13, further comprising forming a top spacer layer on the gate structures, wherein the top spacer layer is silicon boro carbonitride (SiBCN).

* * * * *